United States Patent [19]
Wallander et al.

[11] 3,969,672
[45] July 13, 1976

[54] VOLTAGE LEVEL INDICATOR ESTABLISHED BY A SERIES OF PROGRESSIVELY ENERGIZED LIGHT EMITTING DIODES

[75] Inventors: Gunnar Wallander, Bandhagen; Bernt Bostrom, Hagersten, both of Sweden

[73] Assignee: Audio Stockholm, Stockholm, Sweden

[22] Filed: Feb. 7, 1975

[21] Appl. No.: 548,017

[52] U.S. Cl. .............................. 324/133; 324/122; 340/378 R
[51] Int. Cl.² ........................................ G01R 19/16
[58] Field of Search ..................... 324/122, 133, 66; 340/324 R, 378 R, 336; 307/311, 235 R, 235 A

[56] References Cited
UNITED STATES PATENTS

| | | | |
|---|---|---|---|
| 2,817,815 | 12/1957 | Evans | 324/122 X |
| 3,351,928 | 11/1967 | Smola | 340/324 R |
| 3,740,644 | 6/1973 | Schag et al. | 324/66 |
| 3,795,863 | 3/1974 | Umeda et al. | 324/122 |
| 3,796,951 | 3/1974 | Joseph | 324/133 X |

*Primary Examiner*—Gerard R. Strecker

[57] ABSTRACT

This invention relates to a voltage level detector having a string of series coupled light emitting elements, such as light emitting diodes or low voltage lamps, as indicating devices. The light emitting diodes are series coupled to a constant current source. Parallel to each of the light emitting diodes is the emitter-collector path of a transistor connected. The base electrodes of the transistors are connected to the point with the voltage level to be detected through base resistors. When a transistor is in its conductive state the parallel coupled light emitting diode is by-passed and when a transistor is blocked current is diverted through the parallel coupled light emitting diode which then becomes lit. Since the transistors are series coupled and have their base electrodes connected to the same voltage level point the more the transistors become successively blocked and accordingly their parallel coupled light emitting diodes become successively lit the higher is the voltage between the collector of the end transistor and the voltage level point.

4 Claims, 1 Drawing Figure

U.S. Patent  July 13, 1976  3,969,672
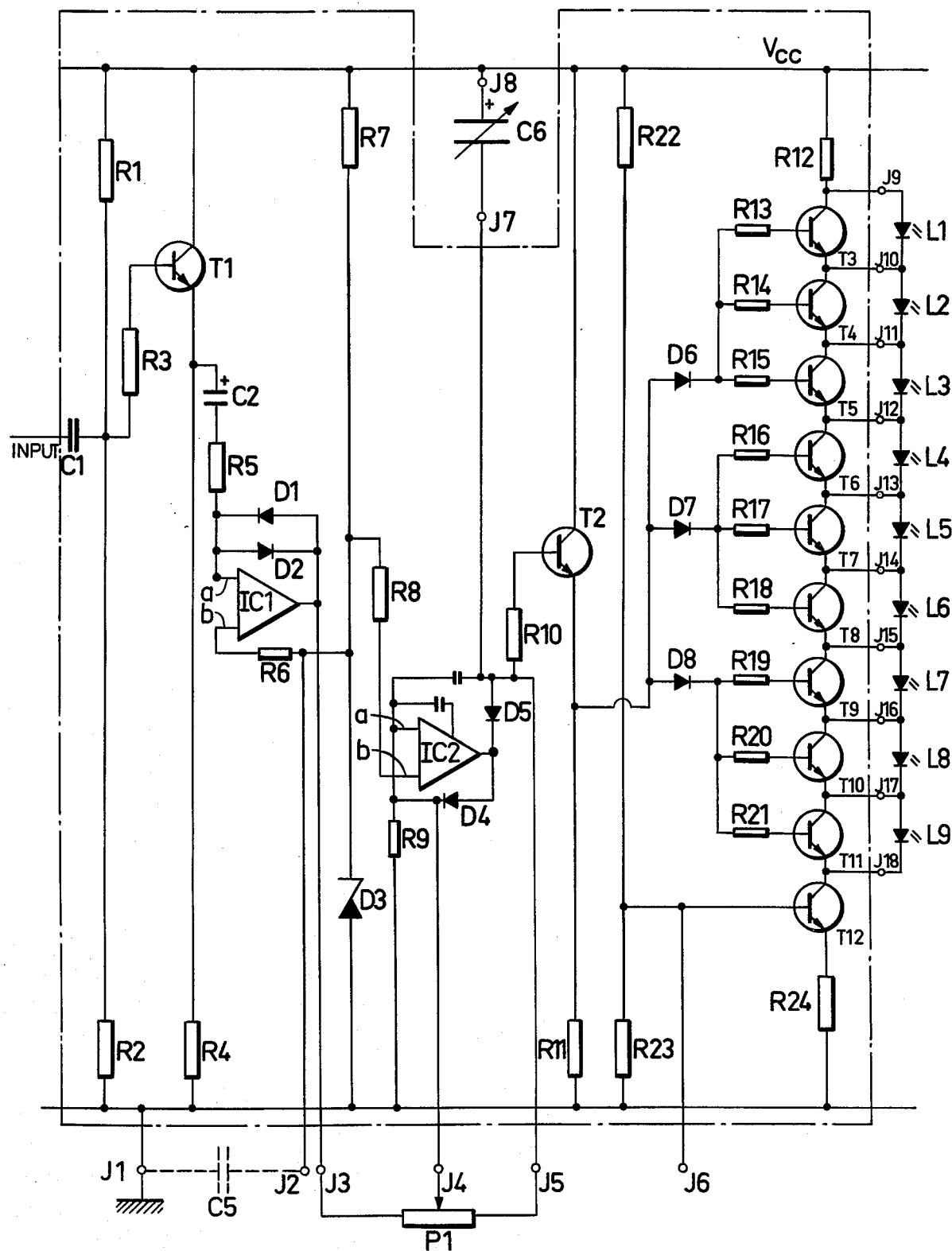

VOLTAGE LEVEL INDICATOR ESTABLISHED BY A SERIES OF PROGRESSIVELY ENERGIZED LIGHT EMITTING DIODES

BACKGROUND OF THE INVENTION

The present invention relates to a voltage level detector, in which a manner of light emitting means, e.g. light emitting diodes, known as "LEDs," or low voltage lamps, are located beside each other and are arranged to be selectively lit by means of a control circuit which functions to turn on each of the light emitting means at a different d.c. voltage level. Thus the voltage level is displayed visually and indicated in a stage like manner by the total number of light emitting means which become illuminated.

Especially in HiFi mixer systems for audio signals, for example, in an apparatus for making the sound track for moving pictures, or for helping a "Disc-Jockey" to give a professional presentation of his program material, there is a certain need for a momentary indication of the peak value of the signal in order to indicate for the operator the momentary state of the signal in each sound channel connected to the mixer. For a presentation of four channel functions, this can be accomplished by four rows of light emitting means such as the above-mentioned light emitting diodes (LEDs) arranged in the form of an X, in which the number of consecutively lighted LEDs in each row, starting from the cross point of the X, indicates the signal level. The greater the number of lighted LEDs, the higher is the signal level. For a number of channels greater than four, it is more practical to have the rows of LEDs for the separate channels arranged as parallel columns.

In earlier systems of this general type, the individual light emitting means of each row were connected electrically in parallel to a source of supply with the result that the current demand from the supply source varied in accordance with the number of light emitting means illuminated in each row. That is, the larger the number of illuminated light emitting means, the greater the current demand. Also the parallel connected light emitting means system was disadvantageous in that the illuminated signal level display unit suffered from a higher current consumption at the same time that the signal generation circuits also have a high current consumption.

It is very desirable to have as little current consumption as possible, especially when higher voltage levels are desired to be indicated, and it is also of a certain advantage to have a uniform current consumption since the need for the stabilizers can then be avoided, or at least the detector circuit does not by its current consumption adversely influence other circuits in an arrangement in which the detector circuit functions as a part.

BRIEF SUMMARY OF THE INVENTION

The general object of the invention is therefore to provide an improved construction for a voltage signal level detector operating with a series of light emitting means such as LEDs and wherein operation thereof is effected with a low and advantageous uniform current consumption.

The invention is especially applicable to a visual display unit for the signal level after that signal has been suitably treated and rectified and is, in effect, a d.c. voltage detector. It has naturally, however, many applications other than that which has been specifically mentioned above. In an illustrative embodiment of the invention, a number of light emitting means in the form of light emitting diodes are electrically connected in series and the series string of diodes is connected to a constant current source. Connected in parallel with each of the diodes is the main path of a voltage level controlled means. The voltage level controlled means preferably consist of a string of transistors with their emitter-collector paths connected electrically in parallel with the corresponding light emitting diodes, and with their base electrodes connected via a base resistor to a common point having the voltage level to be detected. However, it is understood that the light emitting diodes can be replaced with other forms of electrical light emitting means.

When the signal voltage level to be detected is low, all of the transistors will be in a conductive state and hence serve to bypass current around the corresponding light emitting diode coupled in parallel with it. Thus none of the light emitting diodes is lit. As the level of the signal voltage increases, the transistors become blocked in succession from one end of the string with the result that their corresponding light emitting diodes become lit in succession.

The invention, both with respect to the organization of the circuit employing it and with respect to its mode of operation, may best be understood by reference to the following detailed description of a specific embodiment thereof and an accompanying which illustrate it.

BRIEF DESCRIPTION OF DRAWING

The accompany drawing constsits of a single view which is a schematic circuit diagram of a voltage level detector embodying the invention and accompanying circuits for treating the signal, the peak value of which is to be momentarily detected.

DETAILED DESCRIPTION

With reference now to the drawing in which is illustrated the improved signal peak level detecting circuit including the d.c. voltage level detector in accordance with the invention, the input to the detector is fed, for example, with the audio signal output of a channel in, for example, a mixer or a tape recorder, or the like, which signal level is to be indicated momentarily in a visual manner, in order to provide a possibility for correcting the peak value of the signal to an appropriate level, or to have it kept within certain limits indicated by the detector.

The input is fed through a coupling capacitor C1 to the junction point of a voltage divider consisting of two resistors R1 and R2 connected in series between a d.c. supply voltage source $V_{cc}$ and a reference voltage source, such as ground. The base electrode of an emitter-follower transistor T1 is connected through a resistor R3 to the junction point on the voltage divider. The collector electrode of transistor T1 is directly connected to the voltage source $V_{cc}$, and its emitter electrode is connected to the reference voltage, e.g. ground potential, through an emitter resistor R4. This stage functions as a buffer.

One input terminal "a" of an operational (logarithmic) amplifier IC1 is connected to the emitter electrode of transistor T1 through a series coupling consisting of a coupling capacitor C2 and a gain control resistor R5. The other input terminal "b" of operational amplifier IC1 is connected to a reference voltage point through a resistor R6. This reference voltage point is provided by a Zener diode D3 which in series with a resistor R7 is connected between the supply voltage source $V_{cc}$ and the reference potential which is ground. For smoothing out possible ripples, a capacitor C5 having a high capacitance value is connected across the Zener diode D3. The operational amplifier IC1 is also provided with a feed back path from its output to input terminal "a" comprising two diodes D1, D2 connected in back-to-front relation, i.e., in an anti-parallel manner. These two diodes have an approximately exponential resistor-current characteristic, so that the output signal from the amplifier IC1 is represented by a logarithmic function of its input signal.

The output signal from the logarithmic amplifier IC1 is fed to one end terminal of a potentiometer P1 and thence from a tap point on the latter to the input of a rectifier. This rectifier is composed of an operational amplifier IC2, having one input "a" thereof connected to the tap on potentiometer P1. A resistor R9 is connected between the tap on potentiometer P1 and the reference potential, ground. The other input "b" of amplifier IC2 is connected through a resistor R8 to the same reference voltage point as is the second input "b" of amplifier IC1. The output of amplifier IC2 is connected through a diode D4 to the junction point of resistor R9, the tap on potentiometer P1 and thence also to the input "a" of amplifier IC2. The diode D4 has its anode connected to the output of the amplifier and its cathode to input "a" thereof.

A series coupling of diode D5 and a capacitor C6 is connected between the output of amplifier IC2 and the d.c. supply voltage source $V_{cc}$, the cathode of diode D5 being connected to the amplifier output. Capacitor C6 provides a predetermined integration of the output from amplifier IC2 and is charged through the diode D5. It has a rather high capacitance value in order to provide a "hold" for the signal at its peak values and to also smooth out the signal, so that reading off of the detector is facilitated. The other end terminal of potentiometer P1 is connected to the junction point of diode D5 and capacitor C6.

The base of an emitter-follower transistor T2 is connected through a resistor R10 to the junction between capacitor C6 and diode D5. The collector of transistor T2 is connected directly to the d.c. voltage supply source $V_{cc}$, and its emitter is connected to ground by way of an emitter resistor R11. This provides a predetermined rate of discharge of capacitor C6.

The voltage across capacitor C6 will vary with the signal level at the input of the circuit at capacitor C1, with a certain "hold" to the peak values. The voltage across the collector-emitter path of transistor T2 varies as the voltage across capacitor C6. The input of an improved voltage level detector in accordance with the invention is connected to the emitter of transistor T2. The range of the voltage to be detected is calibrated by the position of the tap on potentiometer P1.

The emitter-collector paths of a string of ten transistor T3 to T12 and resistors R12 and R24 are connected electrically in series between d.c. supply voltage source $V_{cc}$ and ground. Resistor R12 at one end of the transistor string is connected between the collector of transistor T3 and supply voltage source $V_{cc}$. Resistor R24 at the opposite end of the string is connected between the emitter of transistor T12 and the ground point.

Transistor T12 located closest to the ground point has its base electrode connected to the junction of a voltage divider consisting of two resistors R23 and R22 connected between the ground point and the d.c. supply voltage source $V_{cc}$. Transistor T12 thus functions as a constant current source. Any other form of constant current source can of course be used.

Light emitting means in the form of a string of series coupled light emitting diodes (LEDs) L1 to L9 are connected respectively electrically in parallel to each one of the remaining nine series connected transistors T3 to T11. These nine transistors are arranged electrically in three groups of three transistors per group. The emitter of transistor T2 is connected through diode D6 to the bases of transistors T3-T5 by way of corresponding resistors R13-R15. Diode D7 connects the emitter of transistor T2 with the bases of transistors T6-T8 by way of resistors R16-R18, and Diode R8 connects the emitter of transistor T2 with the bases of transistors T9-T11 by way of resistors R19-R21.

The voltage level detector operates in the following manner:

When the potential at the emitter of transistor T2 is high, i.e., when the voltage across capacitor C6 is low, all of the transistors T3 to T11 will be in a conductive state. Resistor 12 is utilized to compensate for the emitter-collector voltage of transistor T2 and the forward bias voltage of diode D6 and the voltage across resistor R13, when the voltage across capacitor C6 lies under the lowest level desired to be indicated, and transistor T3 should accordingly be fully saturated. Owing to the constant current source established by transistor T12, the voltage across resistor R12 is constant. Since the current then passes through all of the saturated transistors T3-T11, none of the diodes L1-L9 will be lit. That is to say, these diodes are all by-passed. When the potential at the emitter of transistor T2 has decreased so much that the potential at the base of transistor T3 has decreased to about the forward voltage LED L1, transistor T3 will become blocked and the current is diverted from T3 through LED L1 which then is lit. When the potential at the emitter of transistor T2 has decreased further, also transistor T4 becomes blocked at a predetermined potential and current is diverted for flow through both the LEDs L1 and L2 to light them. All the other LEDs are not yet lit. Upon a further decrease of the potential at the emitter of transistor T2 transistor T5 becomes blocked and LED L3 becomes lit and so on. When the potential at the emitter of transistor T2 lies at about the collector potential of transistor T12 all the LEDs L1 to L9 will have become lit in succession.

As the emitters and collectors of the blocked transistors at lighted LEDs lie at fixed potentials there are certain leakage currents through their base resistors, which leakage currents increase when the voltage between the collector of the blocked transistors and the emitter of transistor T2 is increased. The leakage currents from all the blocked transistors are superimposed. If the leakage currents must take the path through resistor R11, this means that the resistance of resistor R11 must be low enough to allow for the potential of transistor T2 to sink to the predetermined lowest level where all the LEDs L1 to L9 should be lit. This means a rather high current demand, which is of a certain disadvantage and should be avoided. Furthermore the transistors can be damaged when the potential on their base electrode decreases too much under the potential on the emitter electrode. Therefore the nine transistors T3-T11 have accordingly been arranged in groups of three each with a diode D6, D7, D8 connected between the emitter of transistor T2 and the interconnection point of the base resistors for the transistors in each group. The number of the transistors in each group depends on the characteristics of the other components in the circuit and the voltage range to be detected and naturally one diode can be arranged for each transistor. The diodes D6 to D8 are so poled that they are forward biased when any of the transistors in its group is conducting and back biased otherwise.

In order to get a uniform characteristic for the indicator, the voltages across the lighted LEDs at the current level set by the constant current source including transistor T12 have to be matched for the LEDs in the circuit. If desired, the LED L9 for indicating the highest voltage level can be of another colour than the rest of the LEDs in the row.

While the novel device has been described and illustrated for use with type NPN transistors and with the number of nine LEDs in the series coupling and three diodes D6 to D8, it is understood that the invention is equally applicable for use with PNP type transistors and a different number of components and a different number in each group including one of the diodes D6 to D8. The number to be chosen is a function of the characteristics of the components used and of the voltage of the d.c. voltage source $V_{cc}$. If desired the LEDs can be used to further control other light sensitive circuits. The components used can naturally be exchanged for components with equivalent characteristics.

Also the circuit inside the dash-dotted line in the drawing can be constructed as an integrated circuit with discrete components to the connecting points J1 to J18.

We claim:

1. A voltage level detector comprising a plurality of light emitting means connected electrically in series, a constant current source coupled to said series-connected light emitting means, a voltage supply source connected to the series connection of said light emitting means and said constant current source, a plurality of voltage level controlled means correlated respectively with said light emitting means, each said voltage level controlled means having two main electrodes and one control electrode, the main electrodes of each of said voltage level controlled means being connected electrically in parallel with a corresponding one of said light emitting means and the control electrode thereof being connected to means for providing a control voltage common to all of said voltage level controlled means and which varies with the level of the voltage to be detected, each of said voltage level controlled means in the series being operable sequentially in accordance with a different level of the voltage to be detected to change over from a conducting to a non-conducting state and vice versa whereby each of said voltage level controlled means when in a conducting state functions as a by-pass for current flow around its corresponding light emitting means and when in a non-conducting state functions to force current flow through its corresponding light emitting means, said voltage level controlled means being arranged electrically in groups in one to three means and wherein with respect to each said group individual resistors are connected respectively between a common connection point for the group and the control electrode of a corresponding voltage level controlled means of the group, and wherein diodes are respectively connected between the output of said control voltage providing means and the common connection point for a corresponding group, each of said diodes being forward biased when at least one of the voltage level controlled means of the corresponding group is conducting and back biased when none of the voltage level controlled means of that particular group is conducting.

2. A voltage level detector as defined in claim 1 wherein said voltage level controlled means are constituted by transistors, the collector and emitter electrodes serving as said main electrodes of the voltage level controlled means and the base electrodes of the transistors serving as the said control electrodes.

3. A voltage level detector as defined in claim 1 wherein said light emitting means are constituted by light emitting diodes.

4. A voltage level detector as defined in claim 1 wherein said light emitting means are constituted by light emitting diodes, wherein said level controlled means are constituted by transistors, the collector and emitter electrodes serving as said main electrodes of the voltage level controlled means and the base electrodes of the transistors serving as the said control electrodes said transistors being arranged electrically in groups and wherein with respect to each said group of transistors individual resistors are connected respectively between a common connection point for the group and the base electrode of a corresponding transistor in the group, and wherein diodes are respectively connected between the output of said control voltage and the common point for a corresponding group, each of said diodes being forward biased when at least one of the transistors of the corresponding group is conducting and back biased when none of the transistors of that particular group is conducting.

* * * * *